US012660102B2

(12) United States Patent
Wu et al.

(10) Patent No.: US 12,660,102 B2
(45) Date of Patent: Jun. 16, 2026

(54) VEHICLE PLAYER

(71) Applicant: SHENZHEN COROADS ELECTRONICS LIMITED, Shenzhen (CN)

(72) Inventors: Jianhong Wu, Shenzhen (CN); Wen Lai, Shenzhen (CN)

(73) Assignee: SHENZHEN COROADS ELECTRONICS LIMITED, Shenzhen (CN)

( * ) Notice: Subject to any disclaimer, the term of this patent is extended or adjusted under 35 U.S.C. 154(b) by 99 days.

(21) Appl. No.: 18/806,896

(22) Filed: Aug. 16, 2024

(65) Prior Publication Data

US 2026/0032833 A1 Jan. 29, 2026

(30) Foreign Application Priority Data

Jul. 24, 2024 (CN) .......................... 202421769879.1

(51) Int. Cl.
| | |
|---|---|
| *H05K 5/02* | (2006.01) |
| *H05K 5/00* | (2025.01) |
| *H05K 7/20* | (2006.01) |

(52) U.S. Cl.
CPC ......... *H05K 5/0204* (2013.01); *H05K 5/0026* (2013.01); *H05K 7/2039* (2013.01)

(58) Field of Classification Search
CPC ... H05K 5/0204; H05K 5/0026; H05K 7/2039
See application file for complete search history.

(56) References Cited

U.S. PATENT DOCUMENTS

| | | | |
|---|---|---|---|
| 2015/0327398 A1* | 11/2015 | Achenbach | ............ H04N 23/57 |
| | | | 348/148 |
| 2020/0377035 A1* | 12/2020 | Matthews | ........... B60R 11/0235 |
| 2024/0397644 A1* | 11/2024 | Zhang | .................. H05K 5/0204 |

* cited by examiner

*Primary Examiner* — Jared Walker
(74) *Attorney, Agent, or Firm* — HOWARD M COHN and Associates, LLC

(57) ABSTRACT

The present disclosure provides a vehicle player with optimized applicability including a main body that includes a screen member, a control board member and a bracket member, the screen member electrically connected to the control board member and including an upper installation portion and a lower installation portion respectively arranged on a top end and a bottom end of a rear side thereof; the control board member installed on one of the upper and lower installation portions and the bracket member installed on the other of the upper and lower installation portions. Such improved vehicle player can freely disassemble and assemble the bracket member so that a single spindle structure and a corresponding combination double spindle structure can be switched. In addition, the main body is equipped with a detachable casing to further enhance the adaptability of the vehicle player.

9 Claims, 6 Drawing Sheets

VEHICLE PLAYER

BACKGROUND

1. Technical Field

The present disclosure generally relates to the field of vehicle player technologies.

2. Description of Related Art

A vehicle player is a device that a user installs on a car according to their own needs after the car is purchased. Different types of cars have different reserved installation positions for vehicle players in central control position of the cars, which are generally divided into an upper single spindle structure, a lower single spindle structure, and a combination double spindle structure. However, a conventional vehicle player on the market is usually a fixed structure so that a structure of the conventional vehicle player can't be adjusted to adapt to different installation positions. For example, the upper spindle vehicle player can only be installed in an installation position with the upper spindle structure so that user needs to purchase a corresponding product according to the installation position. Therefore, there is a room for improving the conventional vehicle player.

SUMMARY

The technical problems to be solved: in view of the shortcomings of the related art, the present disclosure provides a vehicle player with optimized adaptability whose structure can be adjusted to adapt to different vehicles for installation.

The technical solution adopted for solving technical problems of the present disclosure is: a vehicle player with optimized applicability according to an embodiment of the present disclosure includes a main body, the main body including a screen member, a control board member and a bracket member; and wherein the screen member is electrically connected to the control board member and includes an upper installation portion arranged on a top end of a rear side thereof, and a lower installation portion arranged on a bottom end of the rear side thereof; wherein the control board member is installed on one of the upper installation portion and the lower installation portion, and the bracket member is installed on the other of the upper installation portion and the lower installation portion.

Wherein the control board member includes a main frame, an upper main board and a lower main board electrically connected to each other, and a plurality of functional interfaces, the screen member connected to a front side of the main frame, a window arranged on the front side of the main frame, wires that are connected to the screen member and the control board member arranged through the window; and wherein the main frame includes a U-shaped frame, a top cover, a bottom cover and a heat sink respectively installed on the U-shaped frame, the upper main board is installed on an upper end of the U-shaped frame and located below the top cover, while the lower main board is installed on a lower end of the U-shaped frame and located above the bottom cover, the plurality of functional interfaces is installed at a rear end of the U-shaped frame, and the heat sink covers an outer side of the rear end of the U-shaped frame and comprises corresponding through-holes for the plurality of functional interfaces to be exposed.

Wherein the top cover and/or the heat sink are equipped with a heat dissipation portion.

Wherein the bracket member includes a first bracket, a second bracket and a plate, the first bracket and the second bracket respectively installed at two ends of the screen member, and the plate connected with the first bracket and the second bracket.

Wherein each of the two ends of the U-shaped frame, the first bracket and the second bracket includes a plurality of mounting holes to adapt to install the vehicle player on different types of cars.

Wherein the vehicle player further includes a cover passing through front and rear ends thereof, and the main body is detachably inserted into the cover.

Wherein the cover is square.

Wherein the cover includes a plurality of elastic bars elastically abutting against the main body, each of the plurality of elastic bars including an inserting member arranged on a free end thereof, the inserting member including two inserting portions extending inwardly and having different layout directions thereof; the main body including a plurality of slot groups, each of the plurality of slot groups including two slot bodies with different layout directions, the inserting portion of the inserting member inserted into the slot body of a corresponding slot group.

Wherein the free end of each of the plurality of elastic bars includes an arc-shaped protrusion protruding inwardly and extending along a front to back direction thereof, the main body includes a arc-shaped groove concaved inwardly, and the arc-shaped protrusion embedded into the arc-shaped groove; one or more insertion grooves formed between the cover and the main body and extending along the front to back direction thereof, a front end of the one or more insertion grooves being opened and a back end of the one or more insertion grooves extending to the arc-shaped protrusion; and wherein the vehicle player further includes an independent unlock board, one or more tongues formed on the unlock board and inserted between the arc-shaped protrusion and the arc-shaped groove by passing through the front end of the one or more insertion grooves to unlock the inserting member and the slot group.

Wherein the tongue includes a guiding member arranged on a tail end thereof and defining an inclined guiding surface thereon.

The present disclosure provides the advantages as below: the structure of the improved vehicle player can be adjusted, and the bracket member can be disassembled and assembled, so that the vehicle player can switch between a single spindle structure and a double spindle combination structure to adapt to more types of cars, which can enhance the applicability of the vehicle player.

BRIEF DESCRIPTION OF THE DRAWINGS

In order to more clearly understand the technical solution hereinafter in embodiments of the present disclosure, a brief description to the drawings used in detailed description of embodiments hereinafter is provided thereof. The same reference numerals in the accompanying drawings indicate the same or similar components or parts, one of ordinary skill in the related art should understand that these drawings are not necessarily drawn to scale.

Figure 1:
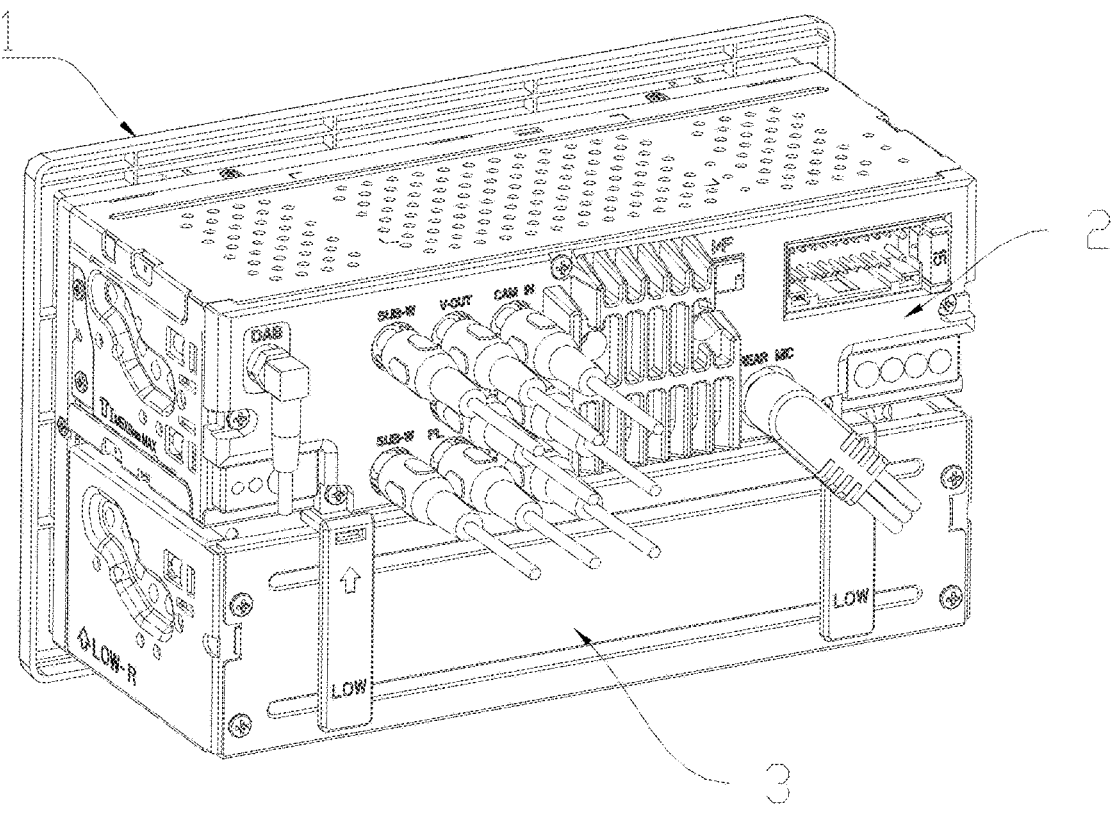
FIG. 1 is a schematic view of a vehicle player in accordance with a first embodiment of the present disclosure.

The element labels according to the embodiment of the present disclosure shown as below:

1001 main body, 1 screen member, 100 screen frame, 101 screen main board, 102 LCD, 103 touch screen, 104 shell, 105 decorative frame, 106 upper installation portion, 107 lower installation portion, 2 control board member, 200 main frame, 201 U-shaped frame, 202 top cover, 203 bottom cover, 204 heat sink, 2040 heat dissipation portion, 2041 through-hole, 205 upper main board, 206 lower main board, 207 interface, 208 window, 209 wire, 3 bracket member, 300 first bracket, 3000 slot group, 3001 first slot body, 3002 second slot body, 3003 arc-shaped groove, 301 second bracket, 302 plate, 303 mounting hole, 304 stiffener, 4 cover, 401 elastic bar, 402 free end, 403 inserting member, 4031 first inserting portion, 4032 second inserting portion, 404 protrusion, 5 unlock board, 500 tongue, 501 guiding member, 502 guiding surface, 6 insertion groove.

DETAILED DESCRIPTION

In order to more clearly understand the technical solution hereinafter in embodiments of the present disclosure, reference will now be made in detail to embodiments, examples of which are illustrated in the accompanying drawings. In the following detailed description, numerous specific details are set forth in order to provide a thorough understanding of the subject matter presented herein. Obviously, the implementation embodiment in the description is a part of the present disclosure implementation examples, rather than the implementation of all embodiments, examples.

According to the described embodiment of the present disclosure, all other embodiments obtained by one of ordinary skill in the related art without the need for a creative labor are within the protection scope of the present disclosure. Unless defined otherwise, the technical terms or scientific terms used for the present disclosure shall be a general meaning commonly understood by those having ordinary skill in the related art to which the present disclosure is applied.

In the description of the present disclosure, it needs to be understood that the terms mentioned below: the terms such as "first" and "second" shown in the specification are only used to describe, but not indicated that the elements of the present disclosure is important or represented the amount of the elements. That is, the features limited by the terms of "first" and "second" may explicitly or implicitly include one or more features. Similar, in the description of the present disclosure, the meaning of the term "one", "a" and "the" don't indicate a quantitative limit, but indicate that it includes at least one unless it is specifically illustrated. Furthermore, the terms such as "include", "including", "comprising" and "comprise" and the like means that elements or items in front of such term is intended to cover the elements or objects appeared the list behind the term and its equivalent, without excluding other elements or items. In the description of the present disclosure, except where specifically otherwise illustrated or limited, the terms "install", "connect", "link" and "fix" used herein should be understood in a broad perceive. Such as, the meaning may be tight connection, removable connection, or integrated connection. The meaning may also be mechanical connection, electrical connection, direct connection or indirect connection through intermediaries, or internal connection within two elements. The meaning of the terms used herein may be understood by one of ordinary skill in the related art according to specific conditions of the present disclosure. In addition, the terms such as "upper", "below", "left", and "right", etc, are shown in the specification of the present disclosure. The indicated orientation or position of the terms shown in the detailed description is based on the orientation or position shown in the figures of the accompanying drawings of the present disclosure, which is only to easily simplify the description of the present disclosure, but not indicated that the devices or elements of the present disclosure should have a particular orientation or should be designed and operated in a particular orientation. So the terms illustrated in the detail description are not by way of the limitation of the present disclosure.

Figure 4:
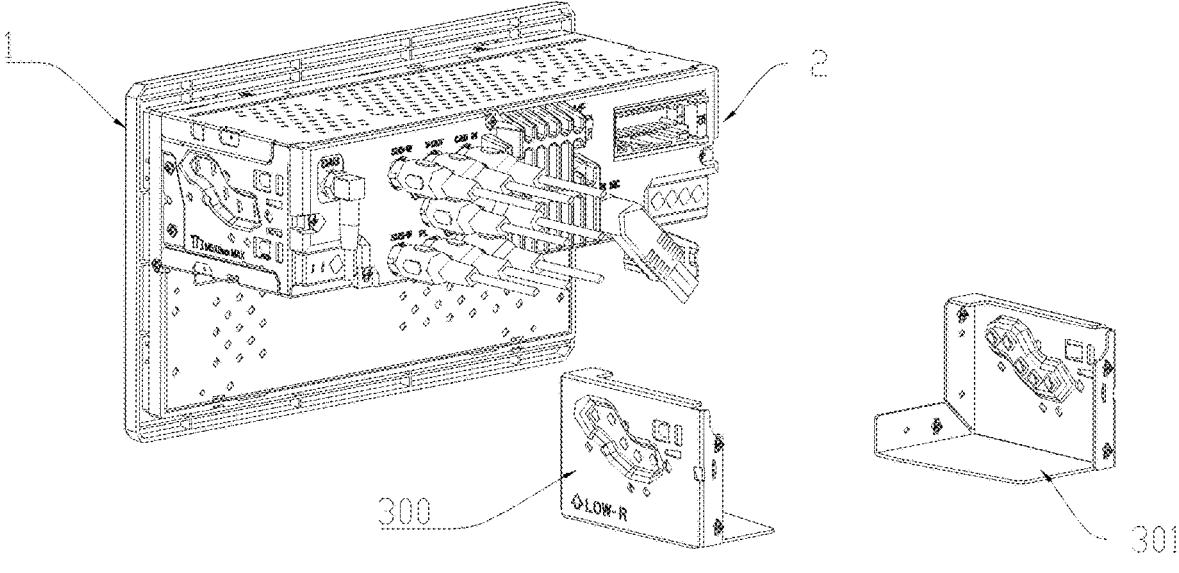
FIG. 4 is an exploded, schematic view of a vehicle player in accordance with a second embodiment of the present disclosure.
Figure 5:
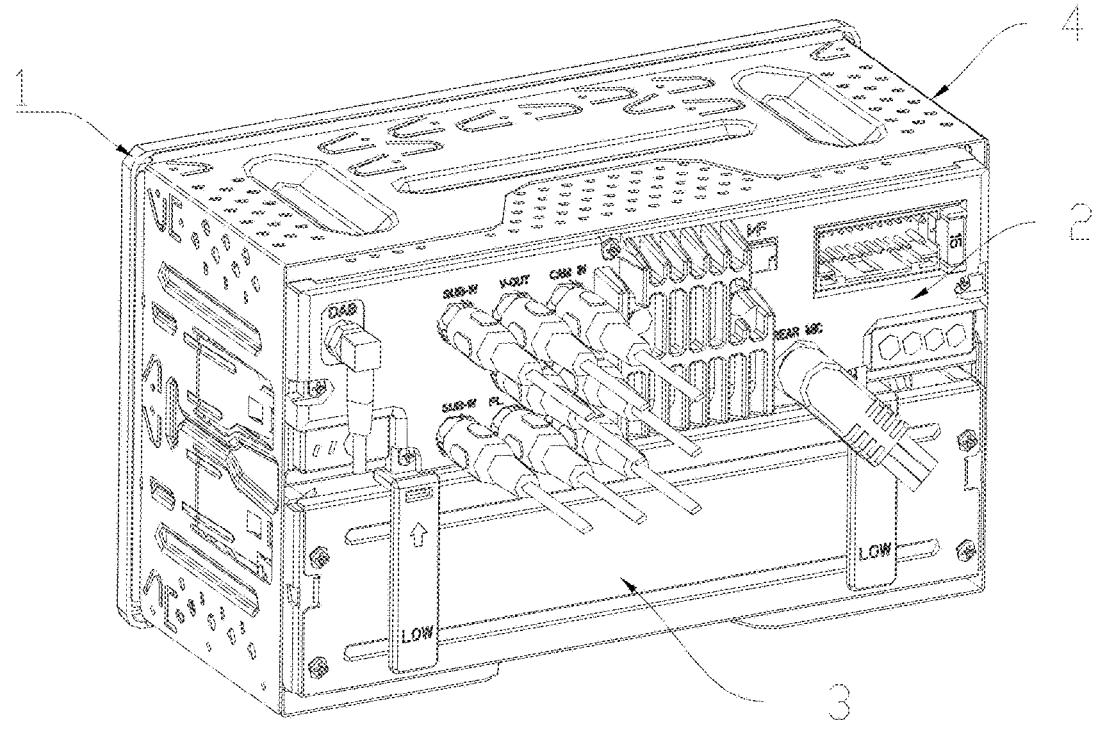
FIG. 5 is a schematic view of a vehicle player in accordance with a third embodiment of the present disclosure.
Figure 6:
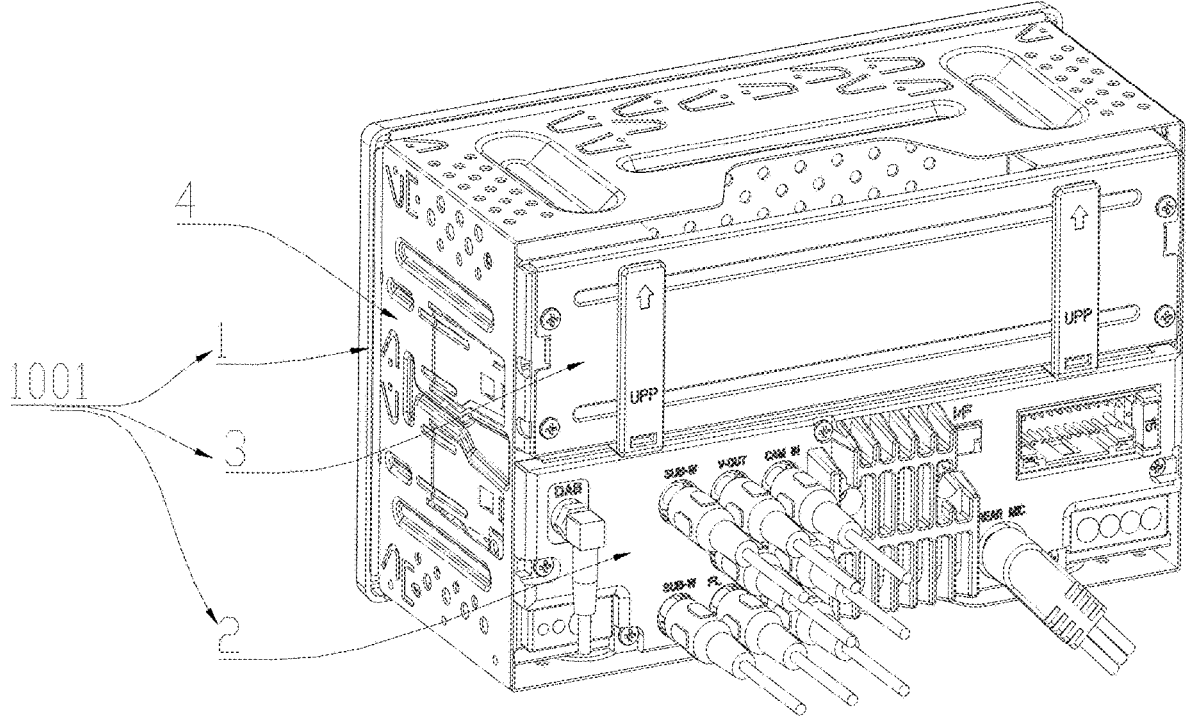
FIG. 6 is a schematic view of a vehicle player in accordance with a fourth embodiment of the present disclosure.
Figure 11:
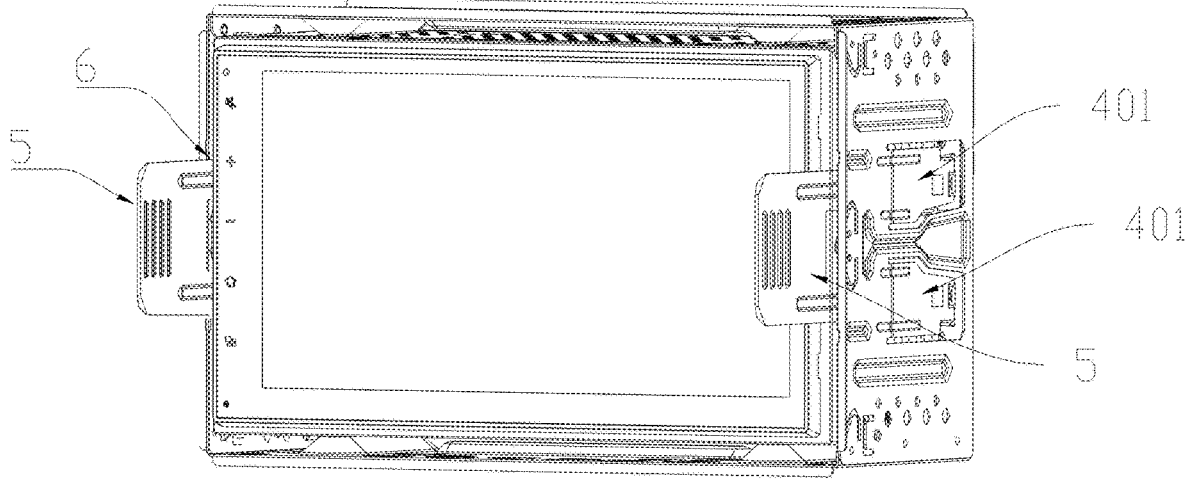
FIG. 11 is a schematic view of a vehicle player in accordance with a fifth embodiment of the present disclosure.

FIG. 1 is shown a vehicle player of a first embodiment of the present disclosure that includes a control board member 2 arranged on an upper installation portion 106, a bracket member 3 arranged on a lower installation portion 107 and a cover 4 is not provided. FIG. 4 is shown a vehicle player of a second embodiment that is similar to the first embodiment, which does not include the cover 4, and a difference between the second embodiment and the first embodiment is that the bracket member 3 of the second embodiment is absent of a plate 302. FIG. 5 is shown a vehicle player of a third embodiment that includes the control board member 2 arranged on the upper installation portion 106, the bracket member 3 arranged on the lower installation portion 107 and the cover 4 is arranged on the periphery thereof. FIG. 6 is shown a vehicle player of a fourth embodiment that the cover 4 is omitted, the control board member 2 arranged on the lower installation portion 107 and the bracket member 3 arranged on the upper installation portion 106. FIG. 11 is shown a vehicle player of a fifth embodiment that includes an unlock board 5.

Referring to FIG. 1 and FIGS. 4-6, the vehicle player with optimized applicability includes a main body 1001 including a screen member 1, a control board member 2 and a bracket member 3. The screen member 1 is electrically connected to the control board member 2 and includes an upper installation portion 106 arranged on a top end of a rear side thereof, and a lower installation portion arranged 107 on a bottom end of the rear side thereof. The control board member 2 is installed on one of the upper installation portion 106 and the lower installation portion 107, and the bracket member 3 is installed on the other of the upper installation portion 106 and the lower installation portion 107.

Both the control board member 2 and the bracket member 3 are connected to the screen member 1 by screws. The control board member 2 is installed on the upper installation portion 106, and the bracket member 3 is installed on the lower installation portion 107, which is commonly known as a double spindle structure with an upper spindle combination. The control board member 2 is installed on the lower installation portion 107, and the bracket member 3 is installed on the upper installation portion 106, which is commonly known as a double spindle structure with a lower spindle combination.

If the bracket member 3 is removed from the double spindle structure with the upper spindle combination, the vehicle player becomes an upper single spindle structure, and if the bracket member 3 is removed from the double spindle structure with the lower spindle combination, the vehicle player becomes a lower single spindle structure. The bracket member 3 can be selected to be omitted or not according to different structures of installation positions of cars, so that the vehicle player can be adapted to different cars with different installation positions.

Figure 2:
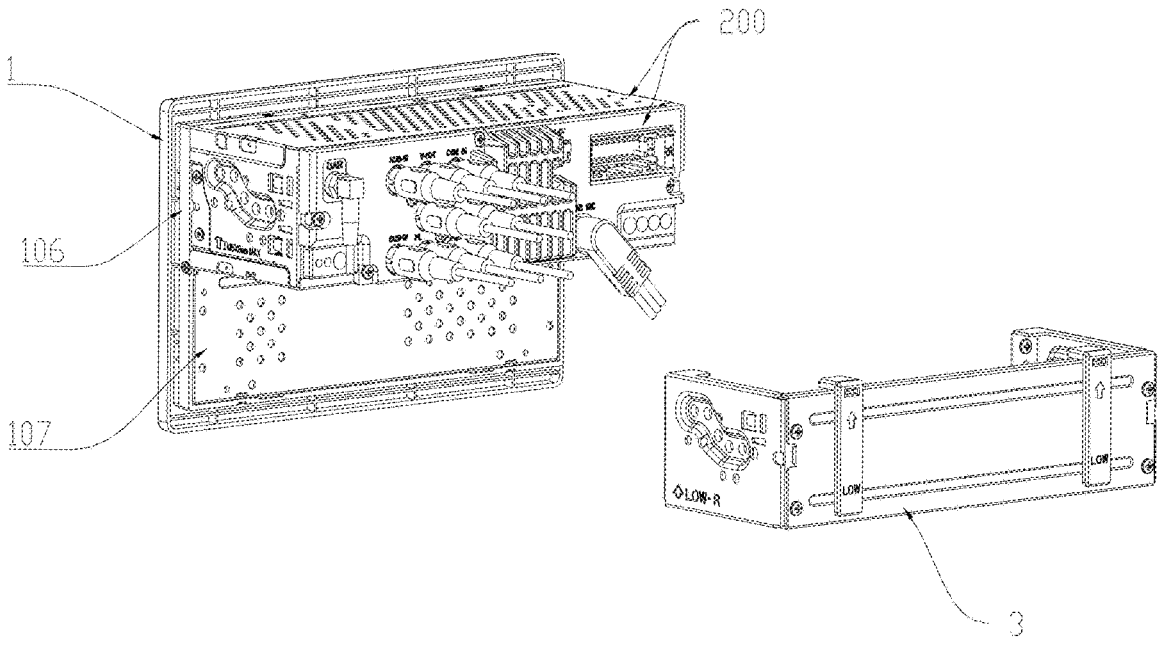
FIG. 2 is an exploded, schematic view of the vehicle player of FIG. 1.
Figure 3:
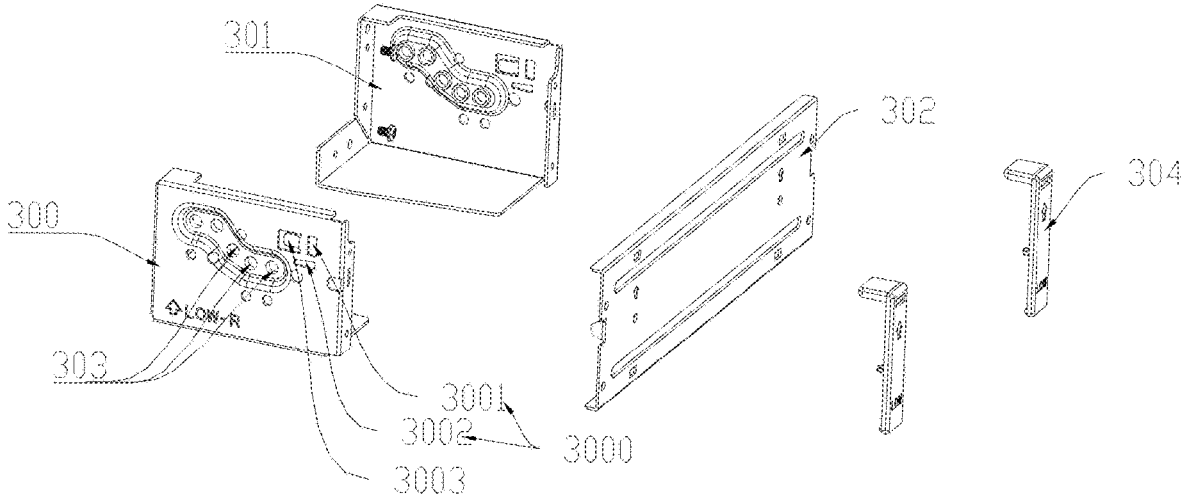
FIG. 3 is an exploded, schematic view of a bracket member of the vehicle player of FIG. 1.

Referring to FIG. 2 and FIG. 3, in some embodiments of the present disclosure, the bracket member 3 of the vehicle player includes a first bracket 300, a second bracket 301 and a plate 302, the first bracket 300 and the second bracket 301 respectively installed at two ends of the screen member 1, and the plate 302 connected with the first bracket 300 and the second bracket 301. Components of the bracket member 3 can be fixedly connected by screws.

Furthermore, the bracket member 3 can be equipped with an L-shaped stiffener 304. A vertical rod of the L-shaped stiffener 304 is attached to a surface of the plate 302, and a horizontal rod of the L-shaped stiffener 304 is clamped between the plate 302 and a top cover 202 of a main frame 200, which can enhance a stability of the bracket member 3 to prevent the bracket member 3 from being deformed. Referring to FIG. 4, in some embodiments of the present disclosure, the bracket member 3 can also be simplified to only consist of the first bracket 300 and the second bracket 301.

Figure 8:
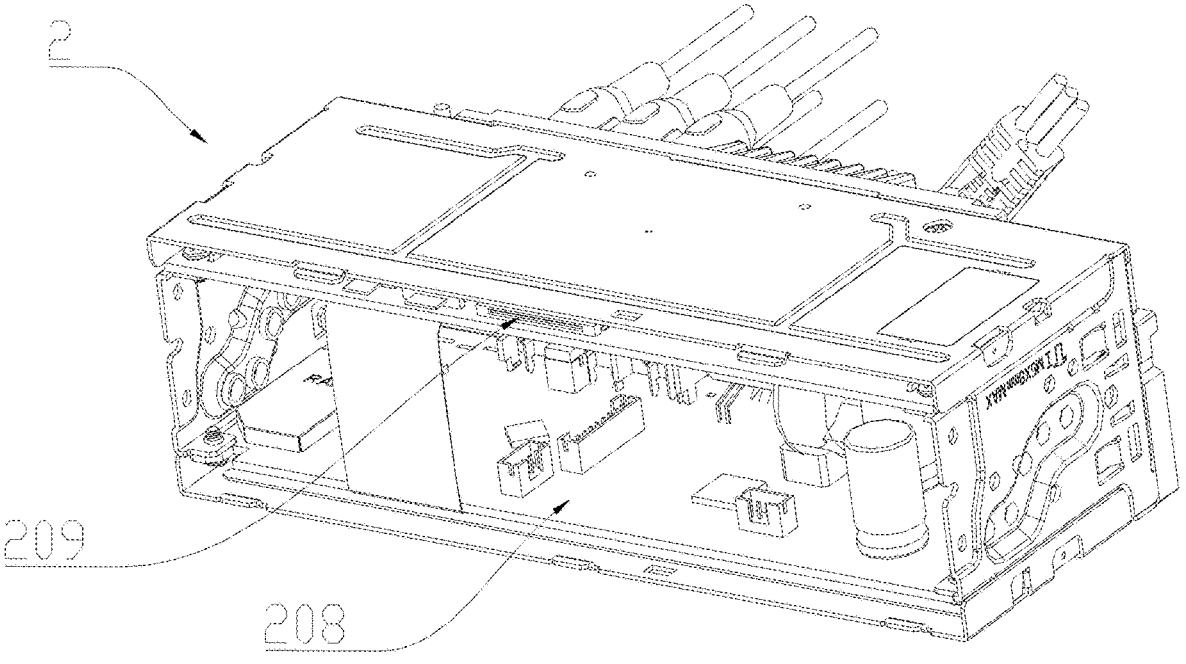
FIG. 8 is a schematic view of a control board member of the vehicle player of FIG. 1.
Figure 9:
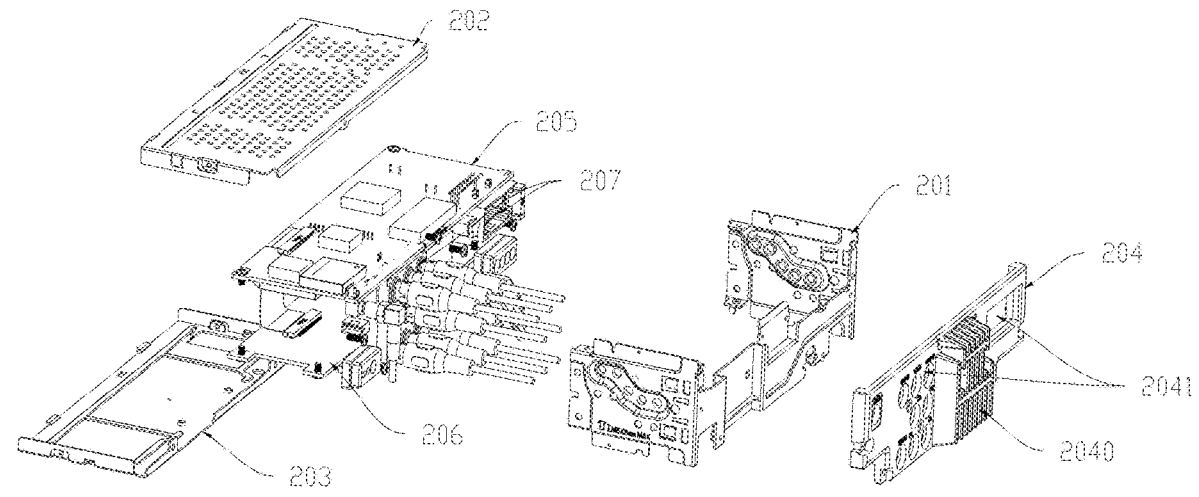
FIG. 9 is an exploded, schematic view of the control board member of the vehicle player of FIG. 1.

Referring to FIG. 8 and FIG. 9, in some embodiments of the present disclosure, the control board member 2 includes a main frame 200, an upper main board 205 and a lower main board 206 electrically connected to each other, and a plurality of functional interfaces 207, the screen member 1 connected to a front side of the main frame 200, a window 208 arranged on the front side of the main frame 200, wires 209 that are connected to the screen member 1 and the control board member 2 arranged through the window 208. The main frame 200 includes a U-shaped frame 201, a top cover 202, a bottom cover 203 and a heat sink 204 respectively installed on the U-shaped frame 201. The upper main board 205 is installed on an upper end of the U-shaped frame 201 and located below the top cover 202, while the lower main board 206 is installed on a lower end of the U-shaped frame 201 and located above the bottom cover 203, the plurality of functional interfaces 207 that generally includes audio and video ports and power ports, etc., is installed at a rear end of the U-shaped frame 201, and the heat sink 204 covers an outer side of the rear end of the U-shaped frame 201 and includes corresponding through-holes 2041 for the plurality of functional interfaces 207 to be exposed.

The upper main board 205 generally includes functions such as a USB, a charging and a GPS, etc., while the lower main board 206 generally includes functions such as a radio, etc. The control board member 2 uses the upper main board 205 and the lower main board 206 to obtain required functional structures, which is conducive to a reasonable layout and avoids an excessive size of the vehicle player.

Correspondingly, the main frame 200 forms a square structure with the window 208 on the front side thereof by a cooperation of the U-shaped frame 201, the top cover 202, the bottom cover 203 and the heat sink 204, which provides a coverage protection for all of the upper main board 205, the lower main board 206 and the plurality of functional interfaces 207. At the same time, the screen member 1 and the control board member 2 are connected to each other by the wires 209, which is set to pass through the window 208 to achieve electrical connection between the screen member 1 and the control board member 2, so that connection structures between the screen member 1 and the control board member 2 can be avoid to be exposed, reduce an external space occupation, and also conducive to protecting a connection stability thereof.

In some embodiments of the present disclosure, each of the two ends of the U-shaped frame 201, the first bracket 300 and the second bracket 301 includes a plurality of mounting holes 303 to adapt to install the vehicle player on different types of cars. There are differences between the installation positions of the vehicle players in different brands and types of cars. However, the mounting holes 303 are usually set at left and right ends of the vehicle player, and the vehicle player is fixed in the installation position by screwing screws into the mounting holes 303, which is possible to fix at two ends of the vehicle player. Specifically, the mounting holes 303 that are required by different types of cars on the market are set on all of the two ends of the U-shaped frame 201, the first frame 300 and the second frame 301 of the vehicle player, so that users can select corresponding mounting holes 303 for assembly the vehicle player according to actual situations.

Furthermore, the top cover 202 and/or the heat sink 204 are equipped with a heat dissipation portion 2040. A plurality of heat dissipation holes can be set on the top cover 202 and a plurality of heat dissipation fins can be set on the heat sink 204.

Figure 7:
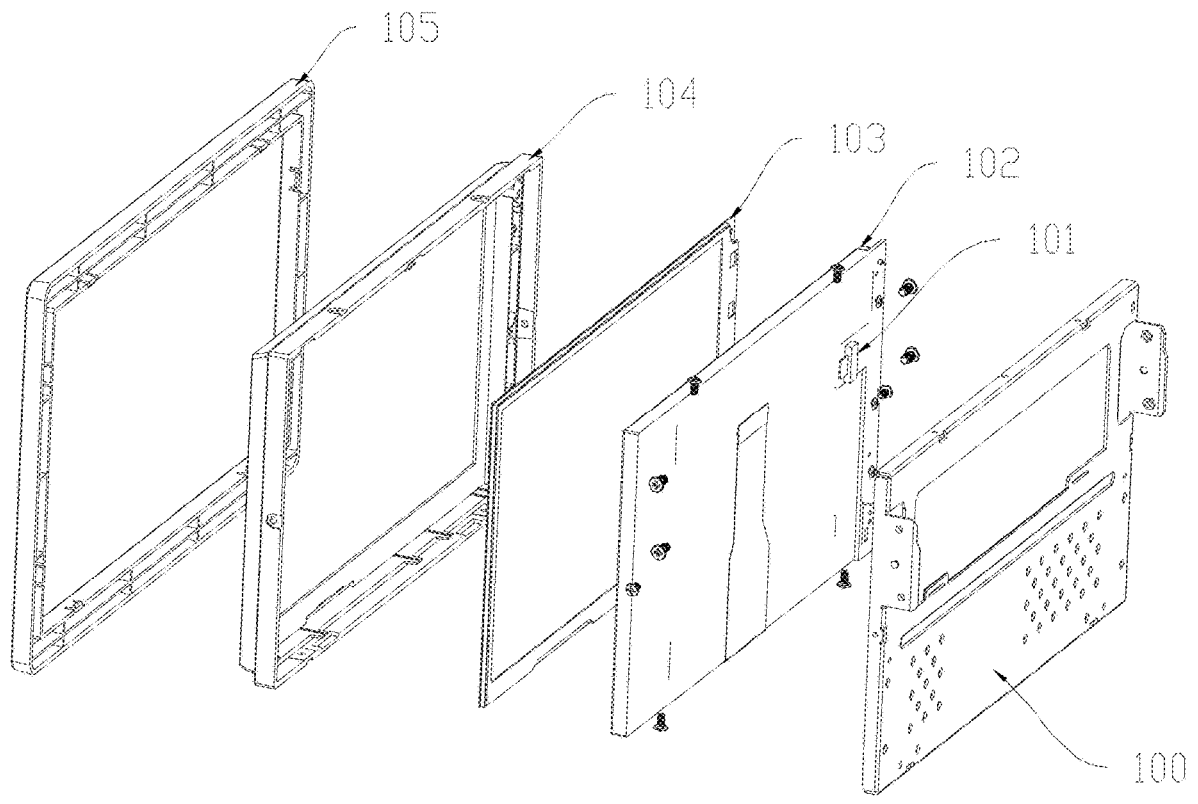
FIG. 7 is an exploded, schematic view of a screen member of the vehicle player of FIG. 1.

Referring to FIG. 7, the screen member 1 generally includes a screen frame 100 as a supporting structure, a screen main board 101, an LCD 102, a touch screen 103, a shell 104 and a decorative frame 105 that are installed on the screen frame 100. Theses above structures are fixedly connected by screws, adhesives or clips. The control board member 2 and the bracket member 3 are directly fixed to the screen frame 100, for example, the U-shaped frame 201 of the control board member 2, and two brackets of the bracket member 3 are screwed onto the screen frame 100.

Figure 10:
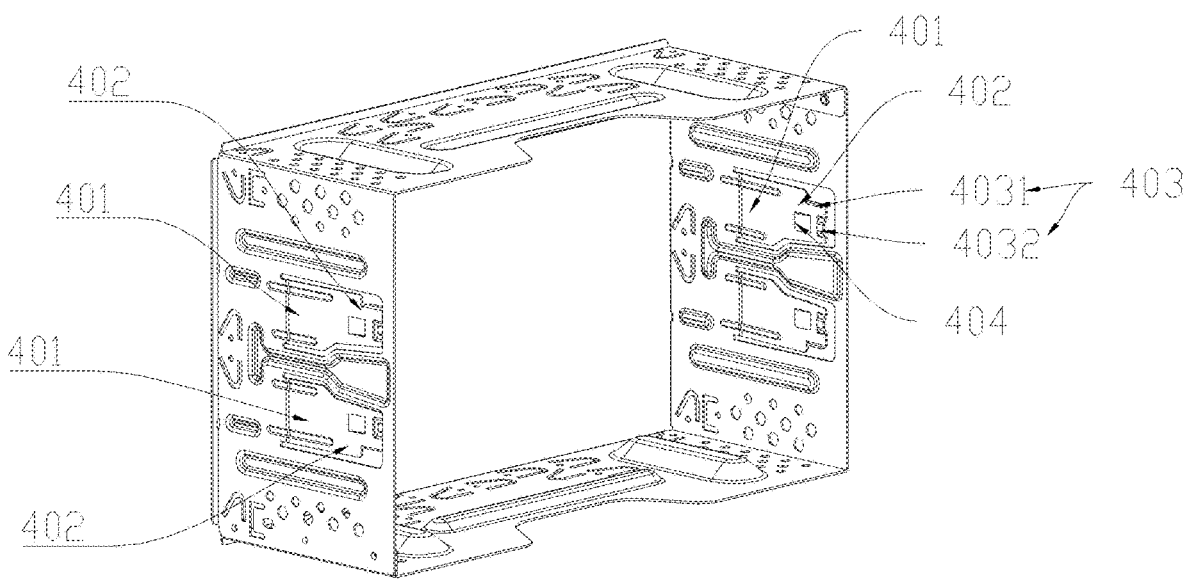
FIG. 10 is a schematic view of a cover of the vehicle player of FIG. 5 and FIG. 6.

Referring to FIG. 5, FIG. 6 and FIG. 10, in some embodiments of the present disclosure, the vehicle player further includes a square cover 4 passing through front and rear ends r: thereof, and the main body 1001 is detachably inserted into the cover 4. The cover 4 is connected with the main body 1001 through a plug-in way. Users can select whether to keep the cover 4 according to actual needs. Some types of cars on the market use the cover 4 to install the vehicle player. First, the cover 4 in installed on a reserved installation position of a central control position, and the vehicle player is then inserted into the cover 4. For some types of cars that do not require the cover 4, it can directly install the main body 1001.

Figure 12:
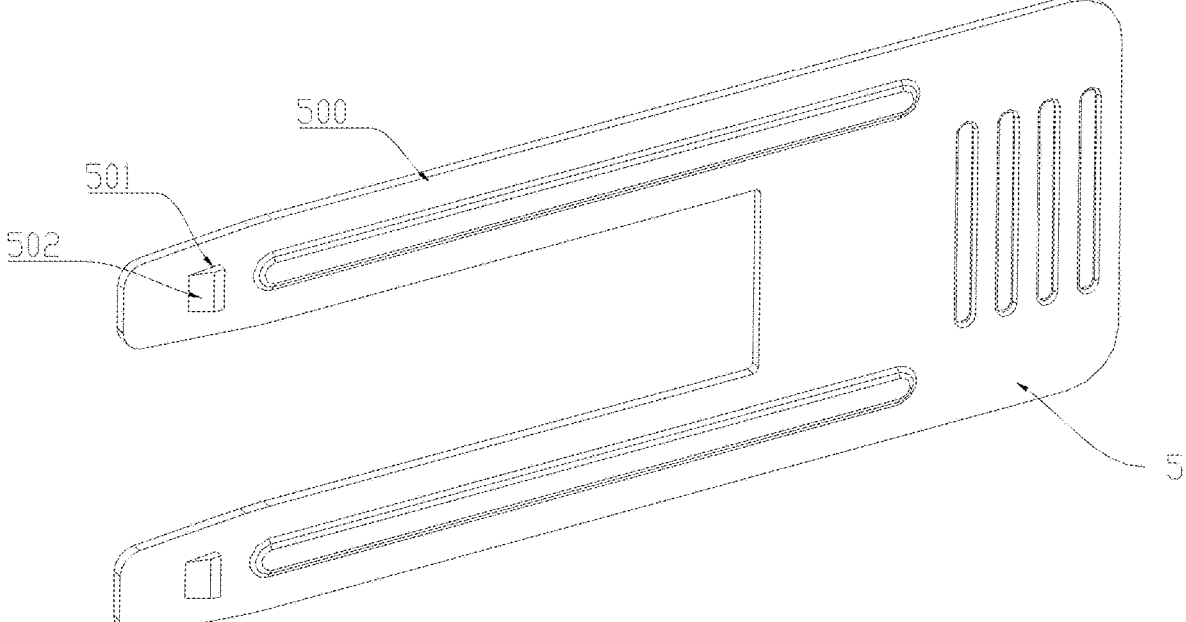
FIG. 12 is a schematic view of an unlock board of the vehicle player of FIG. 11.

Referring to FIGS. 10-12, in some embodiments of the present disclosure,

The cover 4 includes a plurality of elastic bars 401 elastically abutting against the main body 1001, each of the plurality of elastic bars 401 including an inserting member 403 arranged on a free end 402 thereof, the inserting member 403 including a first inserting portion 4031 and a second inserting portion 4032 extending inwardly and having different layout directions thereof; the main body 1001 including a plurality of slot groups 3000, each of the plurality of slot groups 3000 including a first slot body 3001 and a second slot body 3002 with different layout directions, the first and second inserting portions 4031, 4032 of the inserting member 403 inserted into the first and second slot bodies 3001, 3002 of a corresponding slot group 3000.

Specifically, two elastic bars 401 are set on a left end and a right end of the cover 4, respectively. One of the two elastic bars 401 is pressed against the U-shaped frame 201, and the other of the two elastic bars 401 is pressed against the first bracket 300 or the second bracket 301. The inserting member 403 of each of the two elastic bars 401 includes the first inserting portion 4031 and the second inserting portion 4032. Correspondingly, each of the plurality of slot groups 3000 that are arranged on the U-shaped frame 201, the first bracket 300 and the second bracket 301 is equipped with the first slot body 3001 and the second slot body 3002. The first inserting portion 4031 of the elastic bar 401 is inserted into the second slot body 3002, and the second inserting portion 4032 is inserted into the first slot body 3001. In this way, the two groups of inserting portions and slot bodies with different directions are engaged with each other, so that a stability between the elastic bar 401 and the main body 1001 is strengthened, and even under multiple forces, the elastic bar 401 and the main body 1001 are not easily loosened.

In some embodiments of the present disclosure, the free end 402 of each of the plurality of elastic bars 401 includes an arc-shaped protrusion 404 protruding inwardly and extending along a front to back direction thereof, the main body 1001 includes a arc-shaped groove 3003 concaved inwardly, and the arc-shaped protrusion 404 embedded into the arc-shaped groove 3003. One or more insertion grooves 6 is formed between the cover 4 and the main body 1001 and extending along the front to back direction thereof, a front end of the one or more insertion grooves 6 being opened and a back end of the one or more insertion grooves 6 extending to the arc-shaped protrusion 404. The vehicle player further includes an independent unlock board 5, one or more tongues 500 formed on the unlock board 5 and inserted between the arc-shaped protrusion 404 and the arc-shaped groove 3003 by passing through the front end of the one or more insertion grooves 6 to unlock the inserting member 403 and the slot group 3000.

Specifically, the decorative frame 105 of the screen member 1 can be set to be detachable, for example, the decorative frame 105 is connected to other components by screws for easy disassembly, while the insertion groove 6 is formed between the cover 4 and the control board member 2 and the bracket member 3. When it is necessary to remove the cover 4, the decorative frame 105 of the screen member 1 is first removed to expose an opening of the insertion groove 6, and then the unlock board 5 is inserted into the insertion groove 6 to completely disassembly the vehicle player.

The arc-shaped protrusion 404 embedded into the arc-shaped groove 3003 can enhance an assembly stability between the cover 4 and the main body 1001. In an installation environment without needing the cover 4, inserting the unlock board 5 along the front end of the insertion groove 6, the tongue 500 inserted between the arc-shaped protrusion 404 and the arc-shaped groove 3003, pushing the arc-shaped protrusion 404 outwardly, so that the inserting member 403 is separated from the slot group 3000, and then removing the cover 4 from the main body 1001. The number of tongues 500 corresponds to the number of insertion grooves 6, so that it is easy to unlock all the plurality of elastic bars 401 that are arranged on one end of the cover 4 for locking the main body 1001 at the same time.

In some embodiments of the present disclosure, the tongue 500 includes a guiding member 501 arranged on a tail end thereof and defining an inclined guiding surface 502 thereon. When the tongue 500 travels along the insertion groove 6, a thinner portion of the guiding member 501 is first on contact with the arc-shaped protrusion 404, and then the tongue 500 continues to move, a thicker portion of the guiding member 501 gradually pushes the arc-shaped protrusion 404 away from the arc-shaped groove 3003.

In summary, the improved vehicle player can freely disassemble and assemble the bracket member 3, and the single spindle structure and a corresponding combination double spindle structure can be switched. In addition, the main body 1001 is detachably equipped with the cover 4, so the vehicle player can be adapted to various types of cars for installation.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A vehicle player with optimized applicability comprising a main body, the main body comprising:
   a screen member, a control board member and a bracket member; and wherein
   the screen member is electrically connected to the control board member and comprises an upper installation portion arranged on a top end of a rear side thereof, and a lower installation portion arranged on a bottom end of the rear side thereof; wherein the control board member is installed on one of the upper installation portion and the lower installation portion, and the bracket member is installed on the other of the upper installation portion and the lower installation portion;
   the control board member comprises a main frame, an upper main board and a lower main board electrically connected to each other, and a plurality of functional interfaces, the screen member connected to a front side of the main frame, a window arranged on the front side of the main frame, wires that are connected to the screen member and the control board member arranged through the window; and
   the main frame comprises a U-shaped frame, a top cover, a bottom cover and a heat sink respectively installed on the U-shaped frame, the upper main board is installed on an upper end of the U-shaped frame and located below the top cover, while the lower main board is installed on a lower end of the U-shaped frame and located above the bottom cover, the plurality of functional interfaces is installed at a rear end of the U-shaped frame, and the heat sink covers an outer side of the rear end of the U-shaped frame and comprises corresponding through-holes for the plurality of functional interfaces to be exposed.

2. The vehicle player as claimed in claim 1, wherein the top cover and/or the heat sink are equipped with a heat dissipation portion.

3. The vehicle player as claimed in claim 1, wherein the bracket member comprises a first bracket, a second bracket and a plate, the first bracket and the second bracket respectively installed at two ends of the screen member, and the plate connected with the first bracket and the second bracket.

4. The vehicle player as claimed in claim 3, wherein each of the two ends of the U-shaped frame, the first bracket and the second bracket comprises a plurality of mounting holes to adapt to install the vehicle player on different types of cars.

5. The vehicle player as claimed in claim 3, wherein the vehicle player further comprises a cover passing through front and rear ends thereof, and the main body is detachably inserted into the cover.

6. The vehicle player as claimed in claim 5, wherein the cover is square.

7. The vehicle player as claimed in claim 5, wherein the cover comprises a plurality of elastic bars elastically abutting against the main body, each of the plurality of elastic bars comprising an inserting member arranged on a free end thereof, the inserting member comprising two inserting portions extending inwardly and having different layout directions thereof; the main body comprising a plurality of slot groups, each of the plurality of slot groups comprising two slot bodies with different layout directions, the inserting portion of the inserting member inserted into the slot body of a corresponding slot group.

8. The vehicle player as claimed in claim 7, wherein the free end of each of the plurality of elastic bars comprises an arc-shaped protrusion protruding inwardly and extending along a front to back direction thereof, the main body comprises a arc-shaped groove concaved inwardly, and the arc-shaped protrusion embedded into the arc-shaped groove;

one or more insertion grooves formed between the cover and the main body and extending along the front to back direction thereof, a front end of the one or more insertion grooves being opened and a back end of the one or more insertion grooves extending to the arc-shaped protrusion; and wherein the vehicle player further comprises an independent unlock board, one or more tongues formed on the unlock board and inserted between the arc-shaped protrusion and the arc-shaped groove by passing through the front end of the one or more insertion grooves to unlock the inserting member and the slot group.

9. The vehicle player as claimed in claim 8, wherein the tongue comprises a guiding member arranged on a tail end thereof and defining an inclined guiding surface thereon.

* * * * *